United States Patent
Yagihashi (10) Patent No.: US 7,281,198 B2
(45) Date of Patent: Oct. 9, 2007

(54) DATA DECODING METHOD AND APPARATUS AND RECEIVER AND COMMUNICATION SYSTEM APPLYING THE SAME

(75) Inventor: Ayumu Yagihashi, Tokyo (JP)

(73) Assignee: NEC Corporation, Tokyo (JP)

( * ) Notice: Subject to any disclaimer, the term of this patent is extended or adjusted under 35 U.S.C. 154(b) by 440 days.

(21) Appl. No.: 10/895,324

(22) Filed: Jul. 21, 2004

(65) Prior Publication Data

US 2005/0022099 A1    Jan. 27, 2005

(30) Foreign Application Priority Data

Jul. 22, 2003    (JP) .............................. 2003-277564

(51) Int. Cl.
*H03M 13/03* (2006.01)
(52) U.S. Cl. ...................................... 714/794; 714/795
(58) Field of Classification Search ................ 714/794, 714/795
See application file for complete search history.

(56) References Cited

U.S. PATENT DOCUMENTS 6,304,995 B1 * 10/2001 Smith et al. ................ 714/786
6,665,357 B1 * 12/2003 Somayazulu ................ 375/341
6,738,948 B2 * 5/2004 Dinc et al. .................. 714/794
6,813,742 B2 * 11/2004 Nguyen ...................... 714/794
6,996,767 B2 * 2/2006 Chang et al. ............... 714/786

FOREIGN PATENT DOCUMENTS

JP          2002-9633          1/2002
JP          2002-308863        7/2002

OTHER PUBLICATIONS

3GPP—3rd Generation Partnership Project: Technical Specification Group Radio Access Network; Multiplexing and channel coding (FDD) (Release 5); TS 25.212, V5.4.0, pp. 1-74 (2003).

* cited by examiner

*Primary Examiner*—Joseph D. Torres
(74) *Attorney, Agent, or Firm*—Whitham Curtis Christofferson & Cook, PC (57) ABSTRACT

A receiver including a switch for switching output of a memory to one of paths according to content of the output. The memory stores information bits, first check bits and second check bits. The first check bits and second check bits are switched to one of the paths via a rate dematch apparatus to a decoder. The information bits are switched directly to the decoder.

11 Claims, 4 Drawing Sheets

DATA DECODING METHOD AND APPARATUS AND RECEIVER AND COMMUNICATION SYSTEM APPLYING THE SAME

BACKGROUND OF THE INVENTION

1. Field of the Invention

The present invention relates to a receiver suitable for Wide band Code Division Multiple Access (W-CDMA) communication system compliant with 3rd Generation Partnership Project (3GPP).

2. Description of the Related Art

As a technology for implementing fast downlink for a W-CDMA communication system compliant with 3GPP currently being standardized, High Speed Downlink Packet Access (HSDPA) has been proposed (refer to 3GPP TS25.212 (v5.4.0)).

For HSDPA, a publicly known turbo coding/decoding method is used as an error correction method for send data. In the turbo encoding/decoding method, send data strings or information bits are encoded to create two kinds of check bit, a first check bit and a second check bit, for error correction processing. These two kinds of check bit are sent along with the information bits. The receiving side uses the received two kinds of check bit to perform error correction processing and reconstructs send data from the information bit.

The first check bits and the second check bits are reliability information of the information bits created in the turbo encoding processing by a sending side. Each of the first check bits and second check bits has a same amount of data as that of an information bit. Using these kinds of check bit for performing decoding processing by a receiving side can improve the precision of the reconstruction of the information bit.

In HSDPA, a sending side performs first rate match processing, interleave processing and second rate match processing. The first rate match processing thins out an amount of data of check bits in accordance with a buffer capacity of a receiving side after turbo-encoding. The interleave processing changes an order of data strings. The second rate match processing increases or decreases information bits and check bits so as to match an amount of data with a send frame. A receiving side reconstructs information bits and check bits by performing second rate dematch processing first and performing deinterleave processing and first rate dematch processing then. The second rate dematch processing is inverted processing of the second rate match processing. The deinterleave processing is inverted processing of the interleave processing. Information bits and check bits are reconstructed by performing first rate dematch processing. The first rate dematch processing is inverted processing of the first rate match processing. The reconstructed information bit and check bits are used to decode and reconstruct receive data by a turbo decoder.

In HSDPA, since an amount of data to be processed is dramatically increased from that of a conventional CDMA method, a required memory capacity may increase and processes are performed in parallel to reduce processing time. Thus, the size of the circuit tends to increase. Furthermore, since writing and/or reading are performed on a memory more frequently, data processing time and/or power consumption may increase.

SUMMARY OF THE INVENTION

The present invention was made in order to solve these problems of conventional technologies. It is an object of the present invention to provide a receiver to be applied to HSDPA, which can decrease a size of circuits, processing time and/or power consumption.

In order to achieve the object, a receiver according to a first aspect of the present invention is a receiver applying High Speed Downlink Packet Access technology and including a memory for temporarily holding information bits, which are receive data strings, and first check bits and second check bits, which are reliability information of the information bits, a first rate dematch apparatus for performing first rate dematch processing defined by High-Speed Downlink Packet Access on the first check bits and the second check bits, a memory group including memories each holding the information bits supplied through the first rate dematch apparatus and the first check bits and second check bits having undergone the first rate dematch processing and outputting the information bits, first check bits and second check bits at predetermined times, a decoder for decoding and reconstructing receive data by using the information bits, first check bits and second check bits output from the memory group, and a controller for, in synchronization with the output of the information bits from the memory group to the decoder, outputting the first check bits corresponding to the information bits from the memory group to the decoder, causing the first rate dematch apparatus to perform the first rate dematch processing on the second check bits, storing the first rate dematch processing result to the memory group, and, after the end of an output of the first check bits from the memory group and in synchronization with an output of the information bits from the memory group to the decoder, outputting the second check bits corresponding to the first check bits and the information bits from the memory group to the decoder.

A receiver according to a second aspect of the present invention is a receiver applying High Speed Downlink Packet Access technology and including a memory for temporarily holding information bits, which are receive data strings, and first check bits and second check bits, which are reliability information of the information bits, a first rate dematch apparatus for performing first rate dematch processing defined by the High-Speed Downlink Packet Access on the first check bits and the second check bits, a memory group including memories each holding the first check bits and second check bits having undergone the first rate dematch processing and outputting the first check bits and second check bits at predetermined times, a decoder for decoding and reconstructing receive data by using the information bits, first check bits and second check bits, a switch for supplying to the decoder the information bits output from the memory and supplying to the first rate dematch apparatus the first check bits and second check bits output from the memory, and a controller for causing the first rate dematch apparatus to perform the first rate dematch processing on the first check bits and second check bits, storing the first rate dematch processing result to the memory group, and, in synchronization with an output of the information bits from the memory to the decoder, outputting the first check bits and second check bits corresponding to the information bits from the memory group to the decoder.

A receiver according to a third aspect of the present invention is a receiver applying High Speed Downlink Packet Access technology and including a first memory group including multiple memories for holding information bits, which are receive data strings, in unit length of encoding processing and holding first check bits and second check bits, which are reliability information of the information bits, a first rate dematch apparatus for performing first rate dematch processing defined by the High-Speed Downlink Packet Access on the first check bits and the second check bits, a second memory group including memories each holding the first check bits and second check bits having undergone the first rate dematch processing and outputting the first check bits and second check bits at predetermined times, a decoder group including multiple decoders corresponding to the unit of encoding processing and decoding and reconstructing receive data by using the information bits, first check bits and second check bits, a switch group including multiple switches for supplying to the corresponding decoder the information bits output from the memory and supplying to the first rate dematch apparatus the first check bits and second check bits output from the memory, and a controller for causing the first rate dematch apparatus to perform the first rate dematch processing on the first check bits and second check bits, storing the first rate dematch processing result to the second memory group, and, in synchronization with an output of the information bits from the memory to the decoder, outputting the first check bits and second check bits corresponding to the information bits from the second memory group to the decoder group.

With a receiver according to the first aspect of the present invention, processing time by the receiver can be reduced since decoding processing using first check bits and first rate dematch processing on second check bits can be performed at the same time.

With a receiver according to the second aspect of the present invention, since information bits can be directly supplied from the memory to the decoder, an information bit memory for holding information bits is not required in the memory group. Furthermore, processing time relating to the memory group and memory capacity and power consumption of the memory group can be reduced.

With a receiver according to the third aspect of the present invention, processing time by the receiver can be reduced since decoding processing can be performed in parallel.

According to another aspect of the present invention, there is provided a communication system including any one of these receivers. With the communication system, since the efficiency of processing by the receiver can be improved, the efficiency of the entire system can be also improved.

According to another aspect of the present invention, there is provided a method for decoding data based on information bits and check bits to be referred for performing error correction processing on the information bits, the method including the steps of performing processing predetermined for check bits on first check bits by means of a first processor, and performing, in parallel, processing for decoding by using information bits and first check bits by means of a decoder and processing on second check bits, which are different from the first check bits, by means of the first processor. In addition, there are provided a data processor, receiver and communication system using the data decoding method.

According to another aspect of the invention, a method for decoding data based on information bits and check bits to be referred for performing error correction processing on the information bits, the method including the steps of storing information bits and check bits in a memory apparatus, supplying check bits from the memory apparatus to a first processor for performing processing predetermined for check bits, in synchronization with the supply of an output of the first processor to the decoder for performing decoding processing based on information bits and check bits, supplying information bits from the memory apparatus to the decoder without the first processor in the middle, and performing decoding processing by means of the decoder. In addition, there are provided a data processor, receiver and communication system using the data decoding method. In the data decoding method, the step of storing sequentially stores information bits and check bits in multiple memory apparatus, and the step of supplying supplies information bits from the multiple memory apparatus to different decoders. In addition, there are provided a data processor, receiver and communication system using the data decoding method.

According to another aspect of the invention, a system for decoding data including information bits and check bits is provided. The system includes a switch. An input of the switch is connected to an output of a memory for storing the information bits and check bits. One of outputs of the switch is connected to a first path to a decoder via a rate dematch apparatus. Another one of the outputs of the switch is connected to a second path to the decoder without passing through the rate dematch apparatus. The switch outputs the check bits to the first path and outputs the information bits to the second path.

DESCRIPTION OF THE PREFERRED EMBODIMENT

Next, the present invention will be described with reference to drawings.

[First Embodiment]

Figure 1:
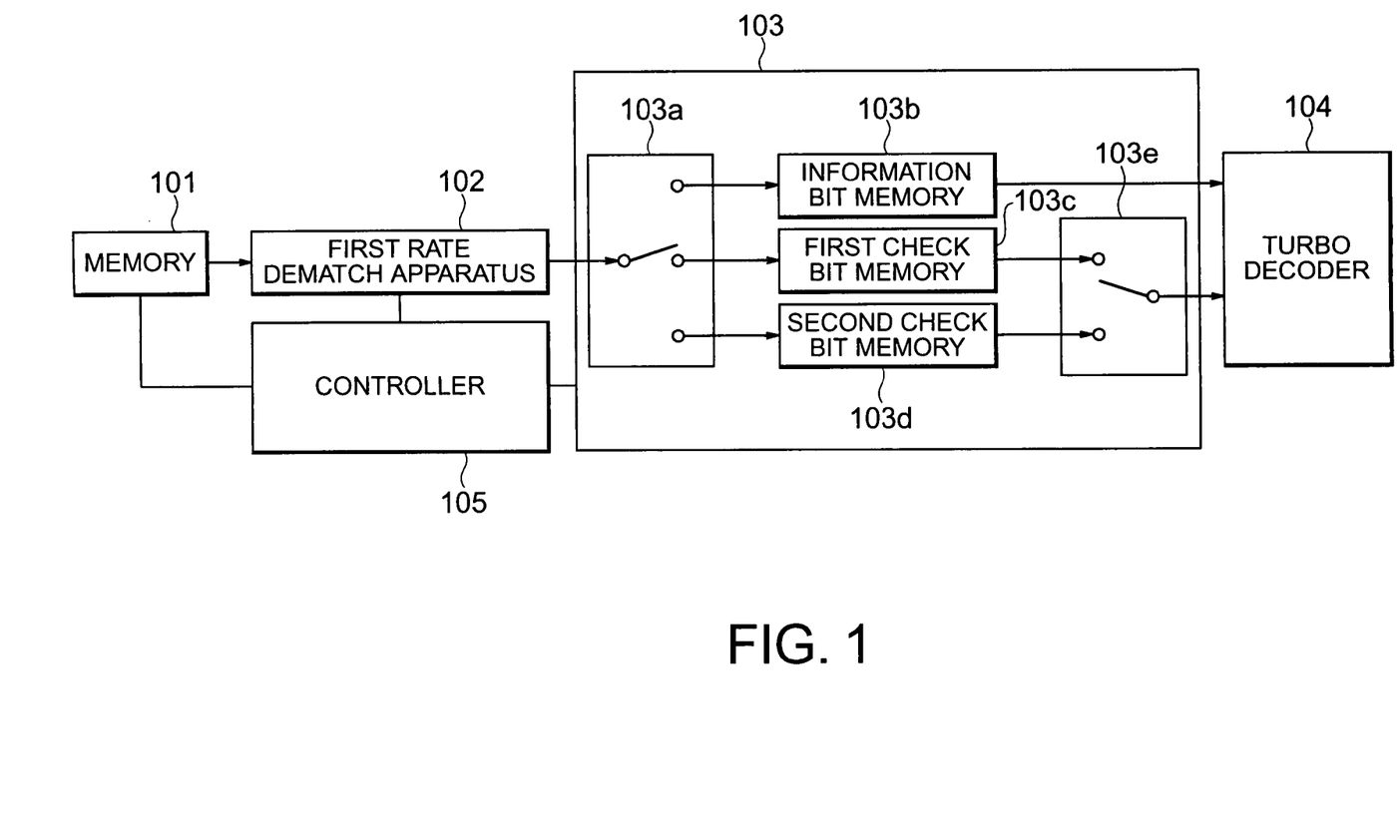
FIG. 1 is a block diagram showing a configuration of a first embodiment of a receiver according to the present invention.

FIG. 1 is a block diagram showing a configuration of a first embodiment of a receiver according to the present invention.

As shown in FIG. 1, a receiver according to a first embodiment includes a memory 101, a first rate dematch apparatus 102, a memory group 103, a turbo decoder 104 and a controller 105. The memory 101 temporarily holds receive data. The first rate dematch apparatus 102 performs first rate dematch processing on first check bits and second check bits. The memory group 103 holds information bits, first check bits and second check bits output from the first rate dematch apparatus 102 and outputs them at predetermined times. The turbo decoder 104 decodes and reconstructs receive data from information bits, first check bits and second check bits. The controller 105 controls operations of the memory 101, first rate dematch apparatus 102 and memory group 103.

The memory group 103 includes an information bit memory 103b, a first check bit memory 103c, a second check bit memory 103d and switches 103a and 103e. The information bit memory 103b holds information bits. The first check bit memory 103c holds first check bits. The second check bit memory 103d holds second check bits. The switch 103a switches input paths to the information bit memory 103b, the first check bit memory 103c and the second check bit memory 103d in accordance with a type of data output from the first rate dematch apparatus 102. The switch 103e switches output paths from the first check bit memory 103c and the second check bit memory 103d in accordance with a type of data supplied to the turbo decoder 104.

Under this construction, the HSDPA-defined bit-collection function is used to separate receive data into information bits, first check bits and second check bits and store them in the memory 101 in succession.

First of all, the controller 105 reads all information bits stored in the memory 101 sequentially from the beginning and supplies the read information bits to the first rate dematch apparatus 102. The first rate dematch apparatus 102 outputs the received information bits to the memory group 103 as they are.

Next, the controller 105 connects the switch 103a to the information bit memory 103b in the memory group 103 and sequentially writes into the information bit memory 103b the information bits output from the first rate dematch apparatus 102.

Once all of the information bits have been stored, the controller 105 reads all of the first check bits stored in the memory 101 sequentially from the beginning and supplies the read first check bits to the first rate dematch apparatus 102. The first rate dematch apparatus 102 performs the first rate dematch processing on the received first check bits and outputs the processing result to the memory group 103. The controller 105 switches the switch 103a to the first check bit memory 103c in the memory group 103 and sequentially writes into the first check bit memory 103c the first check bits output from the first rate dematch apparatus 102.

Next, the controller 105 reads the information bits stored in the information bit memory 103b and outputs the read information bits to the turbo decoder 104. In the memory group 103, the switch 103e is connected to the first check bit memory 103c. In synchronization with processing of reading the information bits, the controller 105 reads the first check bits corresponding to the information bits from the first check bit memory 103c and outputs the read first check bits to the turbo decoder 104.

At the same time, the controller 105 reads out all of the second check bits stored in the memory 101 sequentially from the beginning and supplies the read second check bits to the first rate dematch apparatus 102. The first rate dematch apparatus 102 performs first rate dematch processing on the received second check bits and outputs the processing result to the memory group 103. The controller 105 switches the switch 103a to the second check bit memory 103d in the memory group 103 and sequentially writes into the second check bit memory 103d the second check bits output from the first rate dematch apparatus 102.

Once all of the first check bits have been read from the first check bit memory 103c, the controller 105 switches the switch 103e to the second check bit memory 103d in the memory group 103 and, in synchronization with the reading of the information bits, reads from the second check bit memory 103d the second check bits corresponding to the information bits and outputs the read second check bits to the turbo decoder 104.

The turbo decoder 104 uses the first check bits supplied from the first check bit memory 103c, the second check bits supplied from the second check bit memory 103d and the information bits supplied from the information bit memory 103b to perform processing of decoding the receive data.

Under the construction of this embodiment, while turbo decoding processing is being performed by using first check bits and information bits, first rate dematch processing is performed on the second check bits. Then, the processing result can be stored in the second check bit memory. Therefore, the processing time in the receiver can be reduced.

[Second Embodiment]

Figure 2:
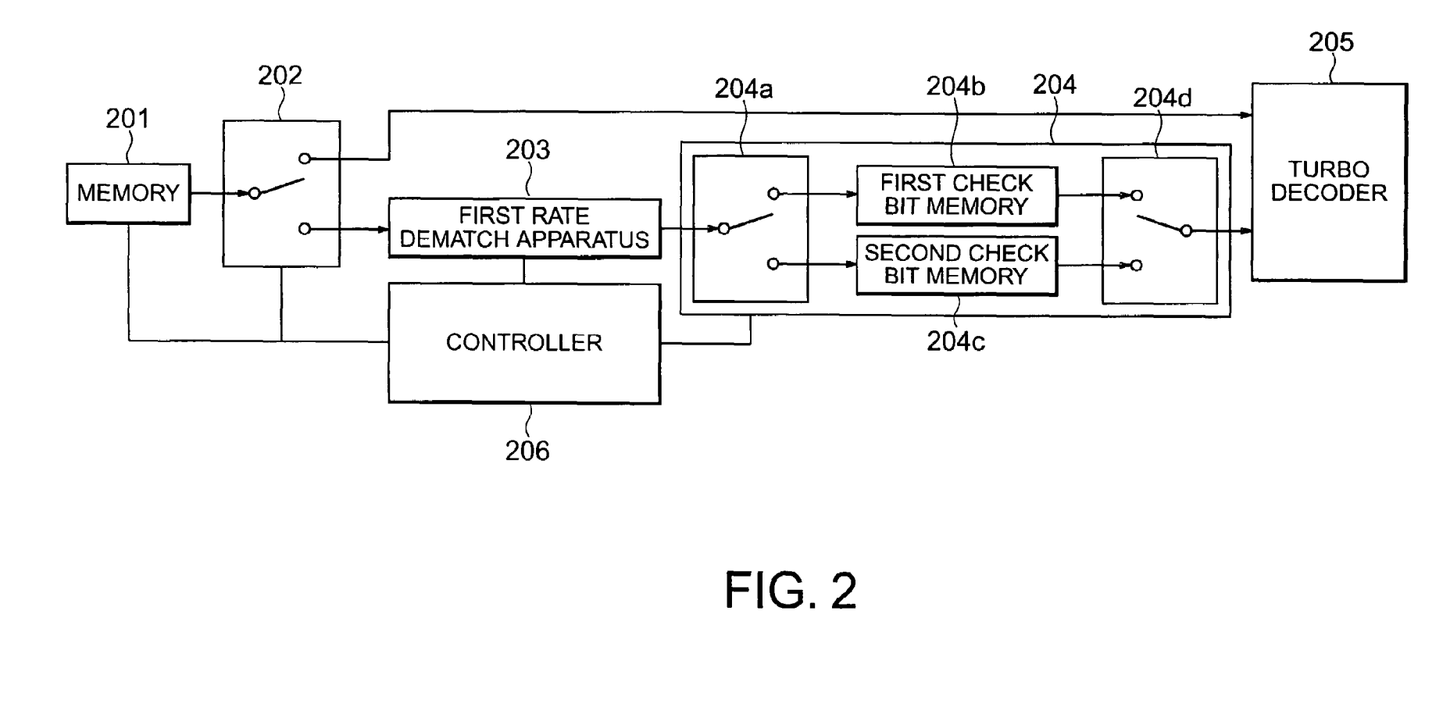
FIG. 2 is a block diagram showing a configuration of a second embodiment of a receiver according to the present invention.

FIG. 2 is a block diagram showing a configuration of a second embodiment of a receiver according to the present invention.

In HSDPA, information bits do not undergo first rate match processing and first rate dematch processing. A receiver according to the second embodiment directly supplies information bits in a memory to a turbo decoder.

As shown in FIG. 2, a receiver according to the second embodiment includes a memory 201, a first rate dematch apparatus 203, a memory group 204, a turbo decoder 205, a switch 202 and a controller 206. The memory 201 temporally holds receive data. The first rate dematch apparatus 203 performs first rate dematch processing. The memory group 204 holds first check bits and second check bits output from the first rate dematch apparatus 203 and outputs the first check bits and the second check bits at predetermined times. The turbo decoder 205 decodes and reconstructs receive data from information bits, first check bits and second check bits. The switch 202 switches connection paths to the first rate dematch apparatus 203 and the turbo decoder 205 in accordance with a type of data output from the memory 201. The controller 206 controls operations of the memory 201, switch 202, first rate dematch apparatus 203 and memory group 204.

In order to read information bits from the memory 201, the switch 202 connects between the output of the memory 201 and the turbo decoder 205. In order to read first check bits or second check bits from the memory 201, the switch 202 connects between the output of the memory 201 and the first rate dematch apparatus 203.

The memory group 204 includes a first check bit memory 204b, a second check bit memory 204c and switches 204a and 204d. The first check bit memory 204b holds first check bits. The second check bit memory 204c holds second check bits. The switch 204a switches data input paths to the first check bit memory 204b and second check bit memory 204c in accordance with a type of data output from the first rate dematch apparatus 203. The switch 204d switches output paths from the first check bit memory 204b and second check bit memory 204c in accordance with a type of data to be supplied to the turbo decoder 205.

Under this construction, like the first embodiment, the HSDPA-defined bit-collection function is used to separate receive data into information bits, first check bits and second check bits and store them in the memory 201 in succession.

The controller 206 first connects the switch 202 to the first rate dematch apparatus 203, sequentially reads all of the first check bits stored in the memory 201 from the beginning, and supplies the read first check bits to the first rate dematch apparatus 203. The first rate dematch apparatus 203 performs first rate dematch processing on the received first check bits and outputs the processing result to the memory group 204. Furthermore, the controller 206 connects the switch 204a to the first check bit memory 204b in the memory group 204 and sequentially writes in the first check bit memory 204b the first check bits output from the first rate dematch apparatus 203.

Next, the controller 206 reads all of the second check bits stored in the memory 201 sequentially from the beginning and supplies the read second check bits to the first rate dematch apparatus 203. The first rate dematch apparatus 203 performs first rate dematch processing on the received second check bits and outputs the processing result to the memory group 204. The controller 206 connects the switch 204a to the second check bit memory 204c in the memory group 204 and sequentially writes in the second check bit memory 204c the second check bits output from the first rate dematch apparatus 203.

Next, the controller 206 connects the switch 202 to the turbo decoder 205, reads all of the information bits stored in the memory 201 sequentially from the beginning, and supplies the read information bits to the turbo decoder 205. Furthermore, the controller 206 connects the switch 204d to the first check bit memory 204b in the memory group 204 and, in synchronization with processing of reading the information bits from the memory 201, reads the first check bits corresponding to the information bits from the first check bit memory 204b. Then, the controller 206 outputs the read first check bits to the turbo decoder 205.

Once all of the first check bits have been read from the first check bit memory 204b, the controller 206 switches the connection of the switch 204d to the second check bit memory 204c in the memory group 204 and, in synchronization with the reading of the information bits, reads from the second check bit memory 204c the second check bits corresponding to the information bits. Then, the controller 206 outputs the read second check bits to the turbo decoder 205.

The turbo decoder 205 uses the first check bits supplied from the first check bit memory 204b, the second check bits supplied from the second check bit memory 204c and the information bits supplied from the memory 201 to perform decoding processing on the receive data.

With the construction of this embodiment, an information bit memory for holding information bits in the memory group 204 is not required by directly supplying information bits from the memory 201 to the turbo decoder 205. Thus, a processing time is not required for transferring information bits to the information bit memory. Therefore, processing time relating to the memory group 204 and memory capacity and power consumption of the memory group 204 can be reduced more than the first embodiment can.

[Third Embodiment]

Figure 3:
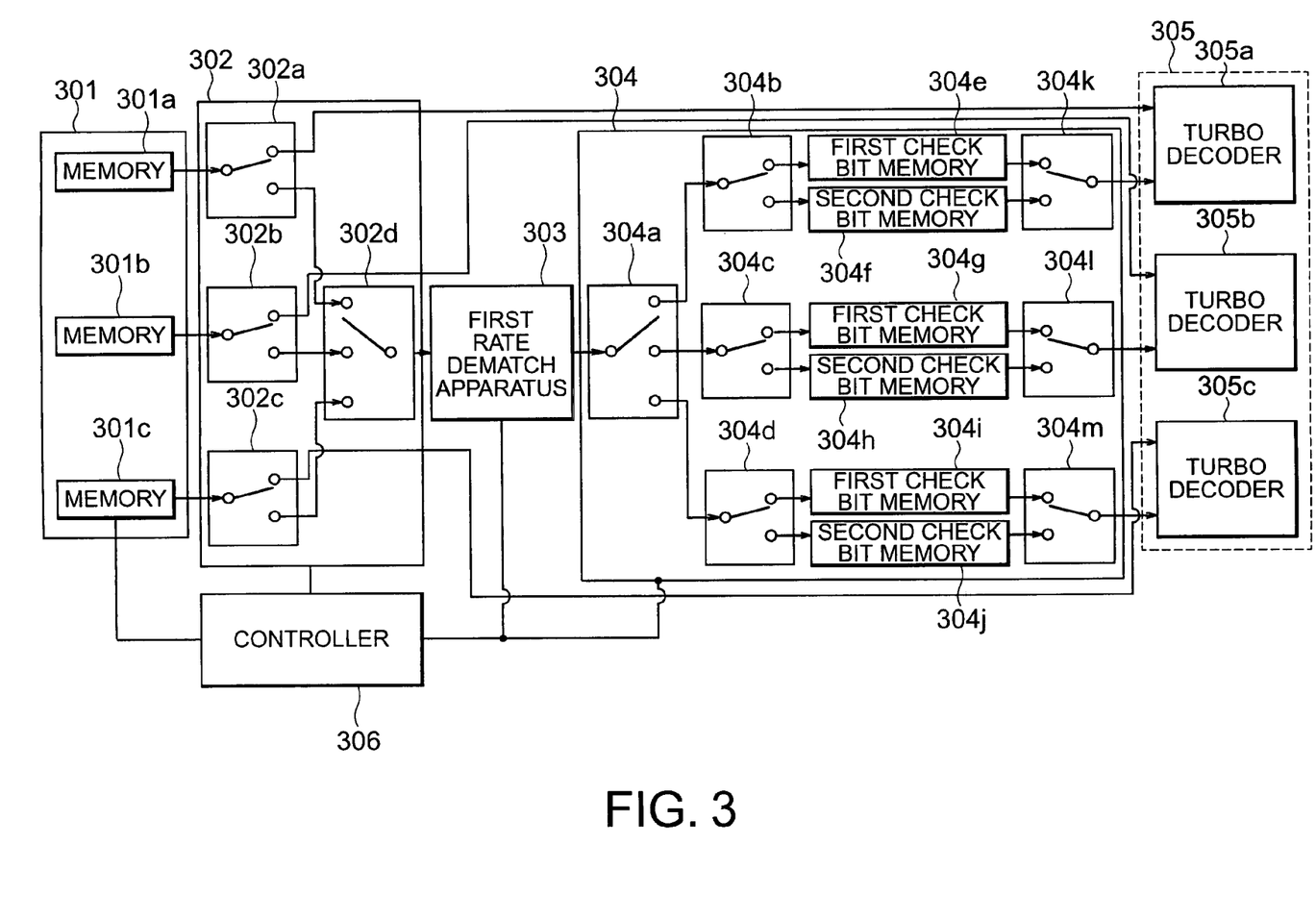
FIG. 3 is a block diagram showing a configuration of a third embodiment of a receiver according to the present invention.

FIG. 3 is a block diagram showing a configuration of a third embodiment of a receiver according to the present invention.

A receiver according to the third embodiment includes multiple turbo decoders.

As shown in FIG. 3, a receiver according to the third embodiment includes a first memory group 301, a first rate dematch apparatus 303, a second memory group 304, a turbo decoder group 305, a switch group 302, and a controller 306. The first memory group 301 has multiple memories each holding information bits in unit length of encoding processing and holding a first check bit and second check bit for each bit in succession. The first rate dematch apparatus 303 performs first rate dematch processing. The second memory group 304 has memories each holding a first check bit and second check bit output from the first rate dematch apparatus 303 and outputs the first check bit and second check bit at predetermined times. The turbo decoder group 305 decodes and reconstructs receive data from information bits, first check bits and second check bits. The switch group 302 switches connection paths to the first rate dematch apparatus 303 and the turbo decoder group 305 in accordance with a type of data output from the first memory group 301. The controller 306 controls operations of the first memory group 301, the switch group 302, the first rate dematch apparatus 303 and the second memory group 304.

The turbo decoder group 305 includes multiple turbo decoders. FIG. 3 shows three turbo decoders 305a, 305b and 305c, for example, among the multiple turbo decoders. The first memory group 301 includes three memories 301a, 301b and 301c, for example, corresponding to the three turbo decoders 305a, 305b and 305c.

The first switch group 302 includes switches 302a, 302b, 302c and 302d. The switches 302a, 302b and 302c divide data output from the memories 301a, 301b and 301c of the memory group 301 into information bits and check bits (including first check bits and second check bits). The switch 302d supplies the first check bits and second check bits output through the switches 302a, 302b and 302c to the first rate dematch apparatus 303.

The second memory group 304 includes first check bit memories 304e, 304g and 304i, second check bit memories 304f, 304h and 304j, switches 304a, 304b, 304c, 304d, 304k, 304l and 304m. The first bit memories 304e, 304g and 304i hold first check bits. The second check bit memories 304f, 304h and 304j hold second check bits. The switch 304a divides data output from the first rate dematch apparatus 303 among the first check bit memory and the second check bit memory. The switches 304b, 304c, 304d switch data input paths to the first check bit memories 304e, 304g and 304i and the second check bit memories 304f, 304h and 304j in accordance with a type of data output from the switch 304a. The switches 304k, 304l and 304m switch data output paths from the first check bit memories 304e, 304g and 304i and second check bit memories 304f, 304h and 304j in accordance with a type to be supplied to the turbo decoder group 305. While FIG. 3 shows a construction example including three turbo decoders 305a, 305b and 305c, two or more turbo decoders are required herein.

Figure 4:
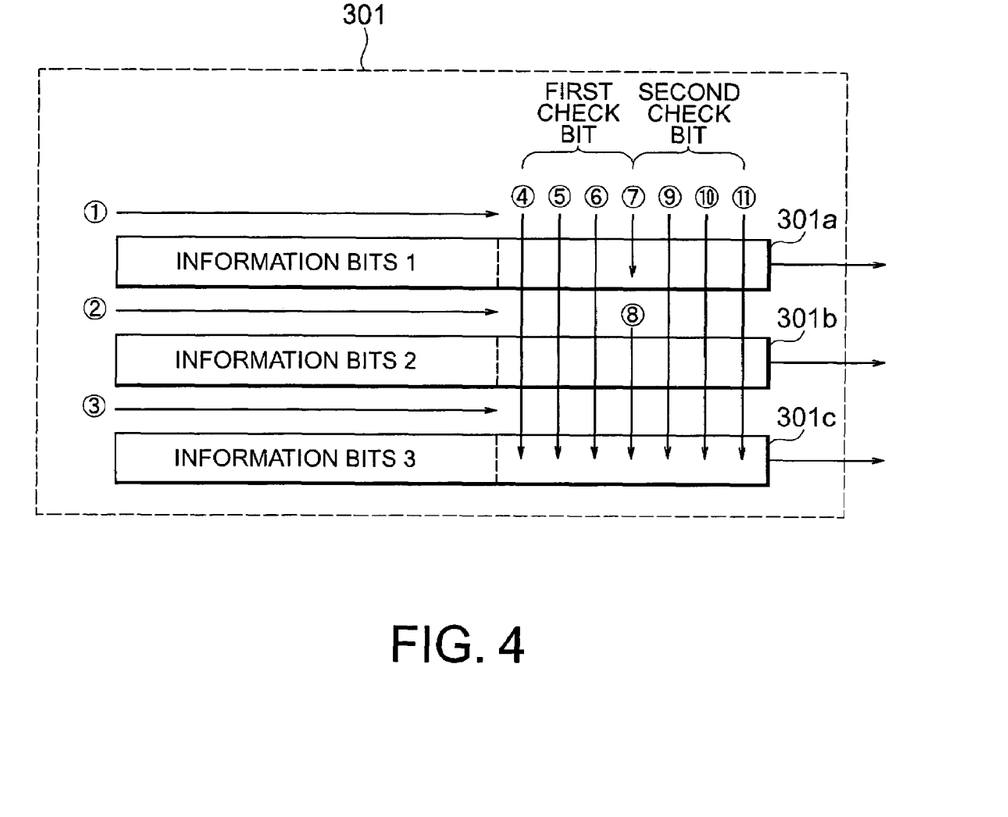
FIG. 4 is a schematic diagram illustrating steps of storing receive data in a first memory group of the receiver shown in FIG. 3.

As shown in FIG. 4, the memories 301a, 301b and 301c of the first memory group 301 store information bits, first check bits and second check bits in succession. The information bits are divided into unit lengths of turbo encoding processing, that is, into code blocks, and the memories 301a, 301b and 301c store the code blocks.

First check bits are stored bit by bit after information bits. For example, the first bit of the first check bits is stored in the memory 301a and subsequent bits are stored in the memories 301a, 301b, 301c, 301a, 301b, 301c and so on bit by bit sequentially in succession as shown in FIG. 4.

Second check bits are stored bit by bit after first check bits. Second check bits are stored subsequently to first check bits in succession. For example, when the last bit of the first check bits is stored in the memory 301a, the first bit of the second check bits is stored in the memory 301b. When the last bit of the first check bits is stored in the memory 301b, the first bit of the second check bits is stored in the memory 301c. When the last bit of the first check bits is stored in the memory 301c, the first bit of the second check bits is stored in the memory 301a. Subsequently, the second check bits are stored in the memories 301b, 301c, 301a, 301b, 301c and so on bit by bit in succession like the first check bits. FIG. 4 shows an example in which the last bit of the first check bits is stored in the memory 301a while the first bit of the second check bits is stored in the memory 301b.

Under this construction, the controller 306 according to this embodiment connects the switches 302a, 302b and 302c of the switch group 302 to the first rate dematch apparatus 303 side and connects the switch 302d to the switch 302a side. The controller 306 reads the first bit of the first check bits stored in the memory 301a and supplies the read first bit to the first rate dematch apparatus 303.

Subsequently, the controller 306 switches the switch 302d to the switch 302b side, reads the first bit of the first check bits stored in the memory 301b and supplies the read first bit to the first rate dematch apparatus 303. Furthermore, the controller 306 switches the switch 302d to the switch 302c side, reads the first one bit of the first check bits stored in the memory 301c and supplies the read first one bit to the first rate dematch apparatus 303.

Next, the controller 306 reads second bits of the first check bits stored in the memories 301a, 301b and 301c and supplies the read second bits to the first rate dematch apparatus 303. Subsequently, in the same manner, the controller 306 reads third and subsequent bits of the first check bits and the second check bits subsequent to the first check bits and supplies the read bits to the first rate dematch apparatus 303.

The first rate dematch apparatus 303 performs first rate dematch processing on the received first check bits and second check bits and outputs the processing result to the second memory group 304.

Next, the controller 306 connects the switch 304a to the switch 304b in the second memory group 304 and connects the switch 304b to the first bit memory 304e. Then, the controller 306 sequentially stores first check bits in one code block to the first check bit memory 304e.

Subsequently, the controller 306 connects the switch 304a to the switch 304c in the second memory group 304 and connects the switch 304c to the first check bit memory 304g in the second memory group 304. Then, the controller 306 sequentially stores first check bits in one code block to the first check bit memory 304g.

Furthermore, the controller 306 connects the switch 304a to the switch 304d in the second memory group 304 and connects the switch 304d to the first check bit memory 304i in the second memory group 304. Then, the controller 306 sequentially stores first check bits in one code block to the first check bit memory 304i. When storing all of first check bits has completed only with the first check bit memories 304e and 304g, the processing of storing first check bits ends at that time.

Once the processing of storing all of the first check bits into the first check bit memories 304e, 304g and 304i has ended, the controller 306 connects the switch 304a to the switch 304b in the second memory group 304 and connects the switch 203b to the second check bit memory 304f in the second memory group 304. Then, the controller 306 sequentially stores second check bits in one code block into the second check bit memory 304f.

Subsequently, the controller 306 connects the switch 304a to the switch 304c in the second memory group 304 and connects the switch 304c to the second check bit memory 304h in the second memory group 304. Then, the controller 306 sequentially stores second check bits in one code block into the second check bit memory 304h.

Furthermore, the controller 306 connects the switch 304a to the switch 304d in the second memory group 304 and connects the switch 304d to the second check bit memory 304j in the second memory group 304. Then, the controller 306 sequentially stores second check bits in one code block into the second check bit memory 304j. When storing all of second check bits has completed only with the second check bit memories 304f or the second check bit memories 304f and 304h, the processing of storing second check bits ends at that time.

Next, the controller 306 connects the switches 304k, 304l and 304m to the first check bit memories 304e, 304g and 304i in the second memory group 304. Then, the controller 306 reads first check bits from the first check bit memories 304e, 304g and 304i bit by bit sequentially from the beginning and supplies the read first check bits to the turbo decoders 305a, 305b and 305c. Furthermore, the controller 306 switches the switches 302a, 302b and 302c in the switch group 302 to the turbo decoders 305a, 305b and 305c. Then, in synchronization with the supply of the first check bits to the turbo decoders 305a, 305b and 305c, the controller 306 reads corresponding information bits stored in the memories 301a, 301b and 301c in the first memory group 301. Then, the controller 306 supplies the read information bits to the turbo decoders 305a, 305b and 305c.

Once the entire processing of reading the first check bits from the first check bit memories 304e, 304g and 304i has completed, the controller 306 switches the connections of the switches 304k, 304l and 304m in the second memory group 304 to the second check bit memories 304f, 304h and 304j. Then, the controller 306 reads second check bits sequentially from the second bit memories 304f, 304h and 304j bit by bit from the beginning and supplies the read second check bits to the turbo decoders 305a, 305b and 305c. Furthermore, in synchronization with the supply of the second check bits to the turbo decoders 305a, 305b and 305c, the controller 306 reads corresponding information bits from the memories 301a, 301b and 301c in the first memory group 301 and supplies the read information bits to the turbo decoders 305a, 305b and 305c.

The turbo decoder 305a performs decoding processing on the information bits supplied in code block from the memory 301a by using the first check bits and second check bits supplied from the second memory group 304. Furthermore, the turbo decoder 305b performs decoding processing on the information bits supplied in code block from the memory 301b by using the first check bits and second check bits supplied from the second memory group 304. The turbo decoder 305c performs decoding processing on the information bits supplied in code block from the memory 301c by using the first check bits and second check bits supplied from the second memory group 304.

Under this construction according to this embodiment, processing of turbo encoding/decoding can be performed in parallel. Thus, processing time for turbo encoding/decoding can be reduced more than that of the second embodiment in addition to the advantages of the second embodiment.

What is claimed is:

1. A data processor for decoding data based on information bits and check bits to be referred for performing error correction processing on the information bits, the data processor comprising:

a memory apparatus for temprarily storing information bits and check bits, wherein said memory apparatus temporarily stores first check bits and second check bits, which are reliability information of the information bits;

a first processor for performing for performing processing predetermined for check bits supplied from the memory apparatus, wherein said first processor is a first rate dematch apparatus for performing first rate dematch processing defined by High-Speed Downlink Packet Access (HSDPA) on the first check bits and the second check bits;

a decoder for performing decoding processing based on information bits and check bits; and a switch for switching an output of the memory apparatus to one of the first processor and the decoder, wherein, in synchronism with the supply of an output of the first processor to the decoder, information bits are supplied from the memory apparatus to the decoder without the first processor in the middle.

2. The data processor according to claim 1, further comprising a memory group including memories each holding the first check bits and the second check bits having undergone the first rate dematch processing and outputting the first check bits and the second check bits at predetermined times.

3. The data processor according to claim 2, wherein said switch supplies to the decoder the information bits output from the memory apparatus and supplies to the first rate dematch apparatus the first check bits and the second check bits output from the memory apparatus.

4. The data processor according to claim 3, further comprising a controller for causing the first rate dematch apparatus to perform the first rate dematch processing on the first check bits and the second check bits, storing the first rate dematch processing result to the memory group, and, in synchronism with an output of the information bits from the memory apparatus to the decoder, outputting the first check bits and second check bits corresponding to the information bits from the memory group to the decoder.

5. The data processor according to claim 4, wherein the memory group includes:

a first check bit memory for holding the first check bits; and a second check bit memory for holding the second check bits.

6. A data processor for decoding data based on information bits and check bits to be referred for performing error correction processing on the information bits, the data processor comprising:

a memory apparatus for temporarily storing information bits and check bits, wherein the memory apparatus comprises multiple memories, and wherein the multiple memory apparatus comprise a first memory group in which each memory apparatus holds information bits, which are received data strings, in unit length of encoding processing and holding first check bits and second check bits, which are reliability information of the information bits;

a first processor for performing processing predetermined for check bits supplied from the memory apparatus, wherein the first processor performs first rate dematch processing defined by the High-Speed Downlink Packet Access (HSDPA) on the first check bits and the second check bits;

a decoder for performing decoding processing based on information bits and check bits, wherein the decoder comprises multiple decoders, which correspond to the multiple memorys, and wherein the multiple decoders perform decoding processing in parallel; and a switch for switching an output of the memory apparatus to one of the first processor and the decoder, wherein, in synchronism with the supply of an output of the first processor to the decoder, information bits are supplied from the memory apparatus to the decoder without the first processor in the middle.

7. The data processor according to claim 6, further comprising a second memory group including memories each holding the first check bits and the second check bits having undergone the first rate dematch processing and outputting the first check bits and second check bits at predetermined times.

8. The data processor according to claim 7, wherein the multiple decoders corresponding to to the unit of encoding processing and decoding and reconstructing receive data by using the information bits, first check bits and second check bits.

9. The data processor according to claim 8, further comprising a switch group including multiple switches for supplying to the corresponding decoder the information bits output from the memory and supplying to the first rate dematch apparatus the first check bits and second check bits from the memory.

10. The data processor according to claim 9, further comprising a controller for causing the first rate dematch apparatus to perform the first rate dematch processing on the first check bits and the second check bits, storing the first rate dematch processing result to the second memory group, and, in synchronism with an output of the information bits from the memory to the decoder, outputting the first check bits and the second check bits corresponding to the information bits from the second memory group to the decoder broup.

11. The data processor according to claim 10, wherein the second memory group includes:

multiple first check bit memories, corresponding to the decoders, for holding the first check bits; and multiple second check bit memories, corresponding to the decoders, for holding the second check bits.

* * * * *